(12) United States Patent
Kim (10) Patent No.: US 7,542,366 B2
(45) Date of Patent: Jun. 2, 2009

(54) NONVOLATILE SEMICONDUCTOR MEMORY DEVICE WITH WIRED-OR STRUCTURE BLOCKING DATA TRANSMISSION FROM DEFECTIVE PAGE BUFFER

(75) Inventor: Hyung Gon Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 202 days.

(21) Appl. No.: 11/333,983

(22) Filed: Jan. 17, 2006

(65) Prior Publication Data

US 2006/0158951 A1 Jul. 20, 2006

(30) Foreign Application Priority Data

Jan. 17, 2005 (KR) .................... 10-2005-0004036

(51) Int. Cl.
*G11C 17/18* (2006.01)
(52) U.S. Cl. .............................. 365/225.7; 365/189.05; 365/185.09
(58) Field of Classification Search ............... 365/225.7, 365/200, 205, 207, 185.09, 185.11
See application file for complete search history.

(56) References Cited

U.S. PATENT DOCUMENTS

| | | | | |
|---|---|---|---|---|
| 6,172,921 B1 * | 1/2001 | Park et al. | ................... | 365/200 |
| 6,233,183 B1 * | 5/2001 | Kim et al. | ................... | 365/200 |
| 6,556,479 B2 * | 4/2003 | Makuta et al. | ......... | 365/185.09 |
| 6,671,204 B2 | 12/2003 | Im | | |
| 6,711,087 B2 * | 3/2004 | Afghahi et al. | ........ | 365/230.06 |
| 6,717,857 B2 | 4/2004 | Byeon et al. | | |
| 6,813,184 B2 * | 11/2004 | Lee | ........................ | 365/185.09 |
| 7,027,330 B2 * | 4/2006 | Park | ........................... | 365/200 |
| 7,054,206 B2 * | 5/2006 | Tellier | ........................ | 365/200 |
| 7,110,294 B2 * | 9/2006 | Kawai | ................... | 365/185.09 |
| 7,154,784 B2 | 12/2006 | Lee | | |
| 7,286,400 B2 * | 10/2007 | Kojima et al. | .......... | 365/185.09 |
| 7,379,333 B2 | 5/2008 | Lee et al. | | |
| 2003/0016562 A1 | 1/2003 | Im | | |
| 2004/0165472 A1 | 8/2004 | Yamazaki | | |
| 2005/0152188 A1 | 7/2005 | Ju | | |
| 2006/0007774 A1 | 1/2006 | Zanardi et al. | | |
| 2006/0133144 A1 | 6/2006 | Lee et al. | | |
| 2006/0181928 A1 | 8/2006 | Lee et al. | | |

FOREIGN PATENT DOCUMENTS

| | | |
|---|---|---|
| JP | 10-208494 | 8/1998 |
| JP | 11-203879 | 7/1999 |
| JP | 04-267698 | 9/1999 |
| JP | 2002-140899 | 5/2002 |
| KR | 2003-61877 | 7/2003 |
| KR | 10-2004-0050697 | 6/2004 |

OTHER PUBLICATIONS

English language abstract of Japanese Publication No. 10-208494.
English language abstract of Korean Publication No. 2002-140899.
English language abstract of Korean Publication No. 2003-61877.

* cited by examiner

*Primary Examiner*—Gene N. Auduong
(74) *Attorney, Agent, or Firm*—Marger Johnson & McCollom, P.C.

(57) ABSTRACT

A nonvolatile semiconductor memory device includes a fuse, a switching enable circuit to generate a switching enable signal in response to a state of the fuse, and a switching unit to couple an internal output line of a page buffer set to a global output line in response to the switching enable signal.

21 Claims, 10 Drawing Sheets

NONVOLATILE SEMICONDUCTOR MEMORY DEVICE WITH WIRED-OR STRUCTURE BLOCKING DATA TRANSMISSION FROM DEFECTIVE PAGE BUFFER

CROSS-REFERENCE TO RELATED APPLICATIONS

This U.S. non-provisional patent application claims priority under 35 U.S.C. § 119 of Korean Patent Application No. 2005-04036 filed on Jan. 17, 2005, the entire contents of which are hereby incorporated by reference.

BACKGROUND OF THE INVENTION

1. Field of the Invention

The description is concerned with nonvolatile semiconductor memory devices, in particular to a nonvolatile semiconductor memory device having a wired-OR structure.

2. Discussion of Related Art

Generally, a nonvolatile semiconductor memory device may use a wired-OR circuit for a verifying operation to find defects in programmed data. For example, in a nonvolatile semiconductor memory device having a cache function, it is possible to highly improve the operation by using a wired-OR scheme that verifies programmed data of several memory cells all together, not in a Y-scanning scheme that verifies programmed data one by one.

However, in such a nonvolatile semiconductor memory device, there may be defects from memory cells, bitlines, or page buffers that temporarily store data read out from memory cells. The defects located in memory cells or bitlines may be cured by way of column repair. In other words, if there is an address designating memory cells or bitlines including a defect in a nonvolatile semiconductor memory device that has a column repair scheme, the data may be redirected toward a spare memory cell or bitline. Thus, the defective memory cell or bitline is repaired.

In contrast, it is practically impossible for a nonvolatile semiconductor memory device, which has defects in the page buffers in themselves, to be repaired completely using the column repair method. That is, although a defective page buffer is substituted with a spare page buffer by means of the column repair scheme, it is impossible to execute a verifying operation with the proper wired-OR scheme when a data arises from the defective page buffer. Therefore, in order to conduct an appropriate wired-OR verifying operation, a nonvolatile semiconductor memory device is required of having a structure capable of blocking data transmission from a defective page buffer, in addition to a column repair circuit that substitutes a defective page buffer with a spare page buffer.

SUMMARY OF THE INVENTION

An embodiment includes a nonvolatile semiconductor memory device including a fuse, a switching enable circuit to generate a switching enable signal in response to a state of the fuse, and a switching unit to couple an internal output line of a page buffer set to a global output line in response to the switching enable signal.

A further embodiment includes a method of operating a semiconductor memory device including detecting a defect in at least one of multiple page buffers of a page buffer set, and disabling the page buffer set using a fuse in response to detecting the defect.

BRIEF DESCRIPTION OF THE DRAWINGS

The accompanying drawings are included to provide a further understanding of the invention, and are incorporated in and constitute a part of this specification. The drawings illustrate example embodiments and, together with the description, serve to explain principles of the invention. In the drawings.

DETAILED DESCRIPTION OF PREFERRED EMBODIMENTS

Embodiments will be described below in more detail with reference to the accompanying drawings. The invention may, however, be embodied in different forms and should not be constructed as limited to the embodiments set forth herein. Rather, these embodiments are provided so that this disclosure will be thorough and complete, and will fully convey the scope of the invention to those skilled in the art. Like numerals refer to like elements throughout the specification.

In one embodiment, two adjacent bitlines may form a pair of bitlines; in other embodiments, each bitline may be selected by its own column address. Therefore, embodiments described herein may refer to two bitlines, i.e., even and odd bitlines, as a 'bitline' without differentiating one of the pair specifically.

Figure 1:
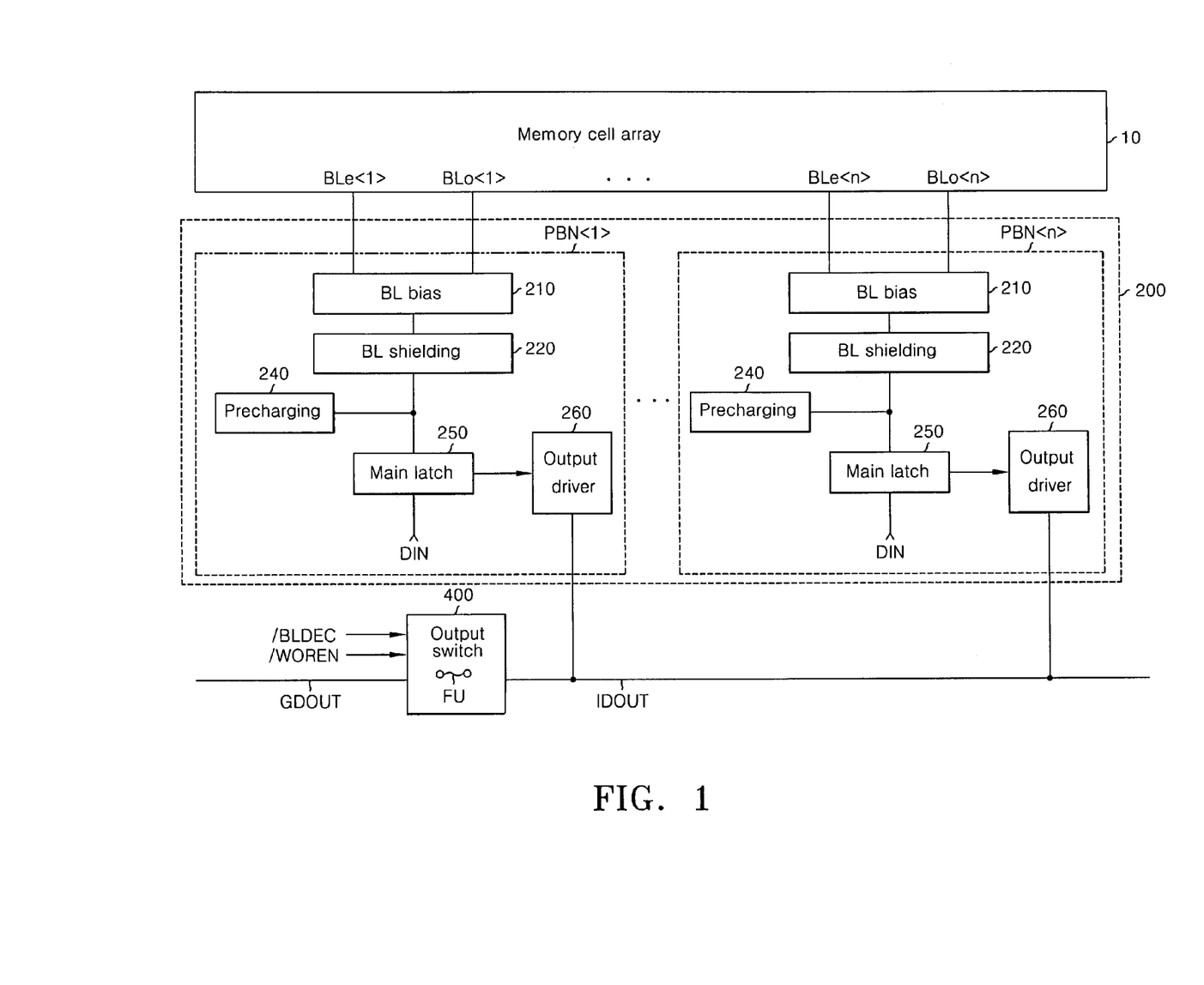
FIG. 1 is a diagram illustrating a nonvolatile semiconductor memory device in accordance with an embodiment.

FIG. 1 is a diagram illustrating a nonvolatile semiconductor memory device in accordance with an embodiment. As shown in FIG. 1, the nonvolatile semiconductor memory device includes of a memory cell array 10, a page buffer set 200, an output switch 400, a data-line precharging circuit 500, and a data-line latch circuit 600.

The memory cell array 10 includes of bitlines BLe<1:$n$>and BLo<1:$n$>, and memory cells to store data on the bitlines BLe<1:$n$>and BLo<1:$n$>during program operations. The memory cells of the memory cell array 10 store data in response to voltage levels on the bitlines BLe<1:$n$>and BLo<1:$n$>.

The page buffer set 200 includes page buffers PBN<1:$n$>corresponding to the bitlines BLe<1:$n$>and BLo<1:$n$>. The page buffers PBN<1:$n$>each connect to different bitlines, but each has the same circuit structure. Thus, this description will refer to an exemplary page buffer by the reference numeral PBN (without differentiating the order of the page buffers by the suffixes such as '1:$n$').

Figure 2:
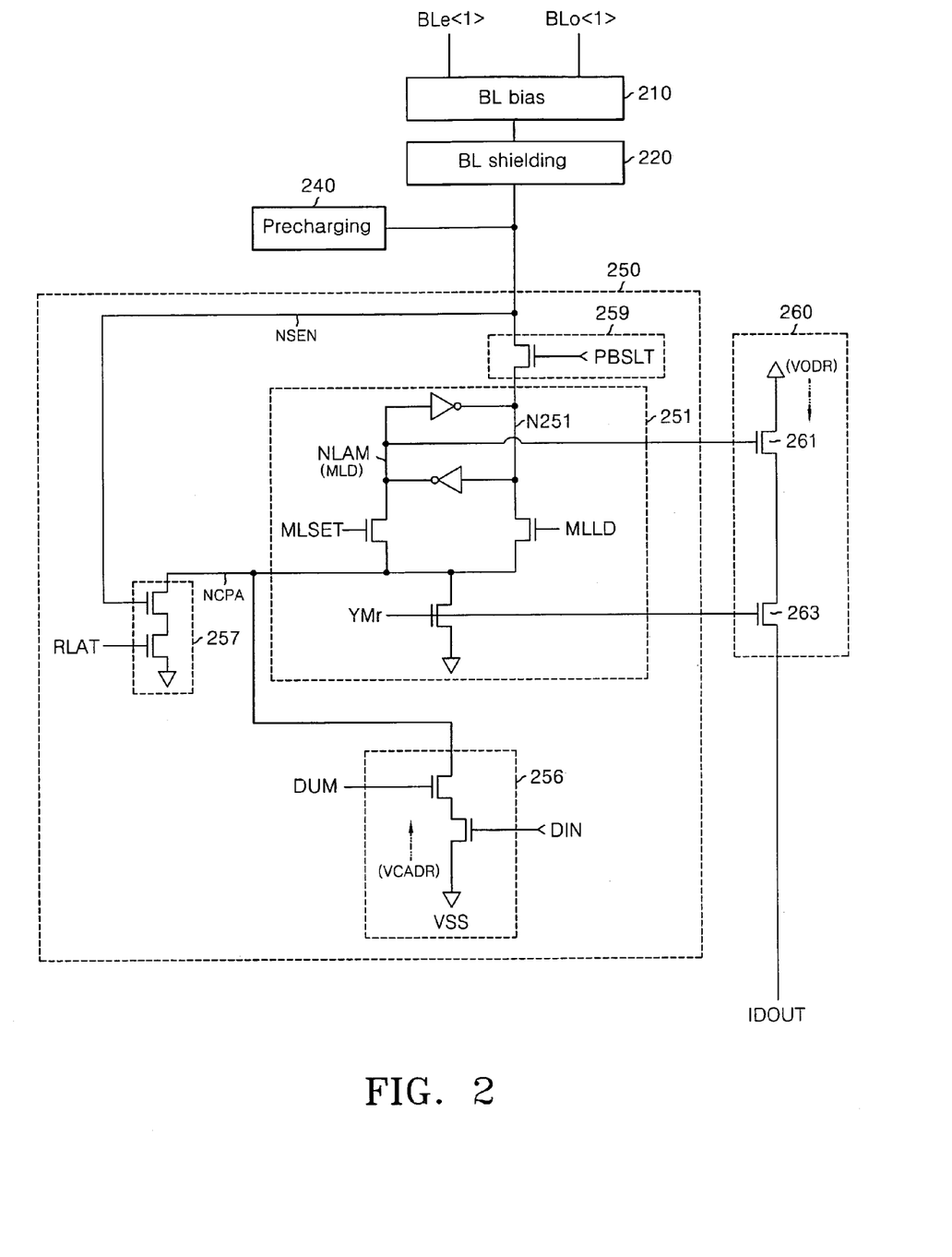
FIG. 2 is a diagram illustrating a page buffer shown in FIG. 1.

FIG. 2 is a diagram illustrating the page buffer PBN shown in FIG. 1. The page buffer PBN stores data, which is transceived through the bitline BLe or BLo, at a main latch node NLAM. In this specification, the data of the main latch node NLAM is referred to as 'main latch data MLD.' Referring to FIG. 2, the page buffer PBN includes a bitline bias block 210, a bitline shielding block 220, a precharging block 230, a main latch block 250, and an output driver 260.

The bitline bias block 210 selects one of two bitlines BLe and Blo, forming a bitline pair, and controls a bias voltage. The bitline shielding block 220 connects the selected bitline to a sensing node NSEN. The precharging block 240 precharges the sensing node NSEN to a power source voltage VCC in response to a sensing precharge signal /PRSEN.

Circuit structures and operations of the bitline bias block 210, the bitline shielding block 220, and the precharging block 230 may be easily understood by those skilled in the art with reference to FIG. 2, so it will not be described in further detail.

The main latch block 250 includes the main latch node NLAM. The main latch data MLD stored at the main latch node NLAM may be set in various ways. In this embodiment, a logical state of the main latch data MLD is controlled by a voltage level of a response transmission node NCPA during a program operation. During the program operation, a voltage level of the response transmission node NCPA is determined by a cache latch data CLD that has a logical state corresponding to an input data. As a result, the logical state of the main latch data MLD is set by transferring the input data to the main latch node NLAM in the program operation.

In summary, if a corresponding bitline BLe or BLo is to be programmed, i.e., to be on a ground voltage VSS, the main latch data MLD is set on a logical "H" level. Alternatively, if a corresponding bitline BLe or BLo is not to be programmed, i.e., to be the power source voltage VCC, the main latch data MLD is set on a logic "L" level.

The output driver 260 may be enabled in response to the main latch data MLD. In other words, the internal output line IDOUT is driven into an output driving voltage VODR (i.e., the ground voltage VSS in this embodiment) in response to the logical "H" level the main latch data MLD.

Data on the internal output line IDOUT is transferred to an external device by way of the output switch 400 (refer to FIG. 1). During this transfer, the internal output line IDOUT is electrically isolated from an input-data transmission path that is lead to the main latch node NLAM from an external source. Thus, the logical condition of the main latch data MLD is controlled not to be affected by a voltage level of the internal output line IDOUT.

Furthermore, the internal output line IDOUT may be driven to the output driving voltage VODR by each of the main latch data MLD of the page buffers PBN<1:n>. When one among the main latch data MLD of the page buffers PBN<1:n>is in a predetermined logical state (a logical "H" level in this embodiment), the internal output line IDOUT, which may be coupled to a global output line GDOUT, is driven to the output driving voltage VODR even though the main data MLD of the rest page buffers PBN<1:n>are all logical "L" levels.

Thus, the nonvolatile semiconductor memory device including the page buffer PBN is able to be configured in the wired-OR structure. Namely, in a verifying mode to confirm a programmed state of selected memory cell MC, an single verifying read-out operation is carried out with using the main latch data MLD of the page buffers PBN<1:n>to find program defects in the memory cells connected to the page buffers PBN<1:n>.

As the nonvolatile semiconductor memory device according to the invention is configured in the wired-OR structure, a time for verifying a programmed state of the selected memory cell is reduced.

In addition, the internal output line IDOUT transfers a data corresponding to the programmed state of the selected memory cell during a normal read mode for reading a data from the selected memory cell, as well as during the wired-OR operation.

Referring to FIG. 2, the main latch block 250 and the output driver 260 will be described.

The main latch block 250 includes the sensing node NSEN, a main latch circuit 251, a cache dumping circuit 256, a sense responding circuit 257, and a buffer selection circuit 259. The sensing node NSEN may receive a data from the bitline BLe or BLo, when it is electrically connected to the bitline BLe or BLo through the bitline shielding block 220.

The main latch circuit 251 includes the main latch node NLAM, storing a data corresponding to a logical state of the response transmission node NCPA, as the main latch data MLD.

The cache dumping circuit 256 responds to a dumping control signal DUM, providing a cache drive voltage VCADR to the response transmission node NCPA in accordance with the cache latch data CLD on the data input node DIN. Preferably, the cache latch data CLD is data stored at another latch for a cache operation of the nonvolatile memory device. In other words, the cache latch data CLD is data to be programmed in the next frame, provided to the main latch circuit 251 through the cache dumping circuit 256.

The sense responding circuit 257 provides a sense responding voltage (VSS in this embodiment) to the sense responding node NCPA in response to the sensing node NSEN and a read latching signal RLAT. The buffer selection circuit 259 provides data, corresponding to the main latch data MLD, to the bitline BLe or BLo by way of the sensing node NSEN.

The output driver 260 may pull the internal output line IDOUT to the output driving voltage VODR in response to the main latch data MLD during the read mode. Preferably, the output driver 260 includes of a first output driving transistor 261 and a second output driving transistor 263. The first output driving transistor 261 is gated by the main latch data MLD. Thus, the first output driving transistor 261 is turned on when the main latch data MLD is set to a logical "H" level. The second output driving transistor 263 is gated by a main-latch selection address signal YMr, making the internal output line IDOUT driven into the ground voltage VSS.

Thus, according to this embodiment, when the main latch data MLD is set on a logical "H" level, the internal output line IDOUT is driven into the ground voltage VSS in response to the logical "H" level transition of the main-latch address selection signal YMr.

Returning to FIG. 1, the nonvolatile semiconductor memory device according to the present invention also includes the output switch 400. The output switch 400 electrically connects the internal output line IDOUT to the global output line GDOUT in response to a wired-OR signal /WOREN and a block decoding signal /BLDEC. Here, the wired-ORing signal /WOREN is activated with a logical "L" level in a wired-OR operation that simultaneously verifies data of the page buffers connected to a single internal output line IDOUT simultaneously. The block decoding signal /BLDEC designates the internal output line IDOUT. That is, the block decoding signal /BLDEC is an address signal designating the page buffer PBN (i.e., the page buffer set 200 in FIG. 1) connected to the single internal output line IDOUT.

Thus, the output switch 400 electrically connects the internal output line IDOUT to the global output line GDOUT during the wired-OR operation mode or when the page buffer set 200 is selected by the block decoding signal /BLDEC.

In addition, if a control fuse FU of the output switch 400 is cut-off, the electrical connection between the internal output line IDOUT and the global output line GDOUT is prevented.

Accordingly, when the control fuse FU included in the output switch 400 is cut off, data transmission is interrupted from the page buffers PBN (the page buffer PBN of the page buffer set 200 in the embodiment of FIG. 1) sharing the internal output line IDOUT.

In other words, the interruption of data transmission in the nonvolatile semiconductor memory device is conducted in units of the page buffer set 200.

As such, the interruption of data transmission units of the page buffer set 200 offers the following merits relative to the case of blocking data transmission units of a page buffer. First, since it reduces the number of fuses for blocking the data transmission by the page buffers, the nonvolatile semiconductor memory device according to the invention is advantageous for layout considerations. In addition, it simplifies the design of a circuit for controlling the fuse cut, so the management for testing and repairing becomes easier.

Figure 3A:
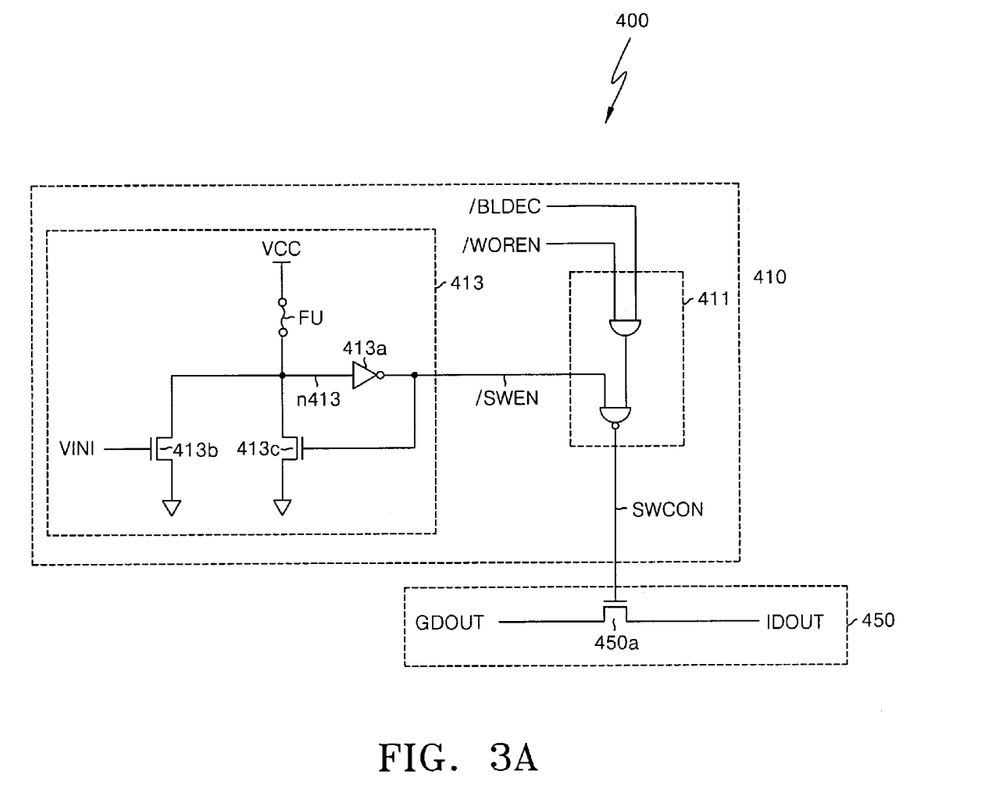
FIG. 3A is a diagram illustrating an example of an output switch shown in FIG. 1.
Figure 3B:
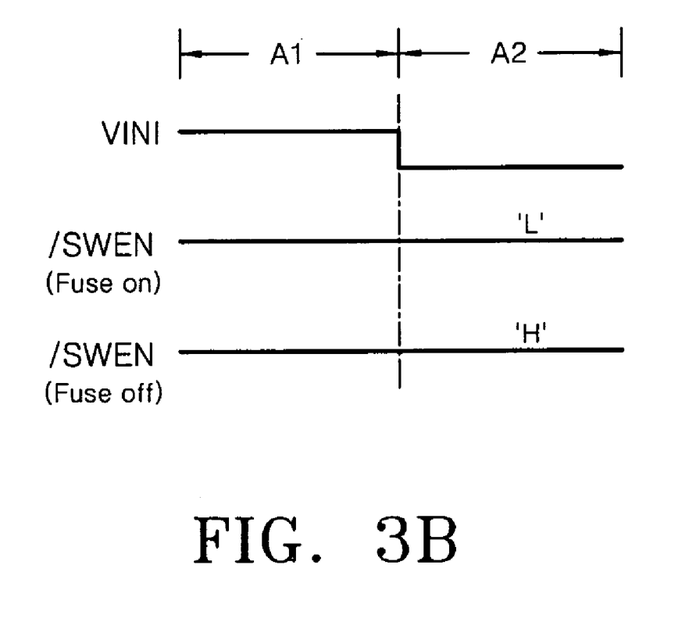
FIG. 3B is a timing diagram showing voltages and signals at nodes in FIG. 3A.

FIG. 3A is a diagram illustrating an example of the output switch 400 shown in FIG. 1, and FIG. 3B is a timing diagram showing voltages and signals at nodes in FIG. 3A. Referring to FIG. 3A, the output switch 400 includes a switch control circuit 410 and an output transmission circuit 450. The switch control circuit 410 includes the control fuse FU, generating a switching control signal SWCON. The switching control signal SWCON may be enabled in the wired-OR operation mode (or period), and disabled when the control fuse FU is cut off.

The output transmission circuit 450 responsive to logical "H" on of the switching control signal SWCON, includes a switching transistor 450a to connect the internal output line IDOUT with the global output line GDOUT.

The switching control circuit 410 includes a switching logic-gating circuit 411 and the switching-enable circuit 413. The switching logic-gating circuit 411 is enabled when a switching-enable signal /SWEN is activated. When it is enabled, and when either the block decoding signal /BLDEC or the wired-ORing signal /WOREN is enabled, the switching control signal SWCON provided from the switching logic-gating circuit 411 becomes active with a logical "H" level.

The switching-enable circuit 413 includes the control fuse FU and generates the switching-enable signal /SWEN. In detail, the switching-enable circuit 413 includes an inverter 413a, a first NMOS transistor 413b, the control fuse FU, and a second NMOS transistor 413c. The inverter 413a logically inverts a signal of an input terminal n413 and then provides the inverted input signal as the switching-enable signal /SWEN.

The uncut control fuse FU maintains the input terminal n413 of the inverter 413a at a logical "H" level in connection. But, if the control fuse FU is cut the input terminal n413 of the inverter 413a may be changed to a logical "L" level.

The first NMOS transistor 413b is gated by an initializing control signal VINI. The initializing control signal VINI is configured to be active during a predetermined period (A1 of FIG. 3B). It is preferred for the first NMOS transistor 413b to have a very small conductivity.

The second NMOS transistor 413c together with the inverter 413a holds a logical state of the switching-enable signal /SWEN generated when the control fuse FU is cut.

In summary, if the control fuse FU is uncut, the input terminal n413 of the inverter 413a is pulled to a logical "H" level. Thus, the switching-enable signal /SWEN, as the output signal of the inverter 413a, is a logical "L" level as shown in FIG. 3B. Therefore, when the control fuse FU uncut, the switching control signal /SWCON may be enabled in response to logical "L" activation of the wired-ORing signal /WOREN.

In contrast, if the control fuse FU is cut off, the input terminal n413 of the inverter 413a may be pulled to a logical "L" level. As a result, the switching-enable signal /SWEN is fixed to a logical "H" level as shown in FIG. 3B. Thus, in the condition of the cutout with the control fuse FU, the switching control signal /SWCON is inhibited to be active with a logical "H" level.

Figure 4A:
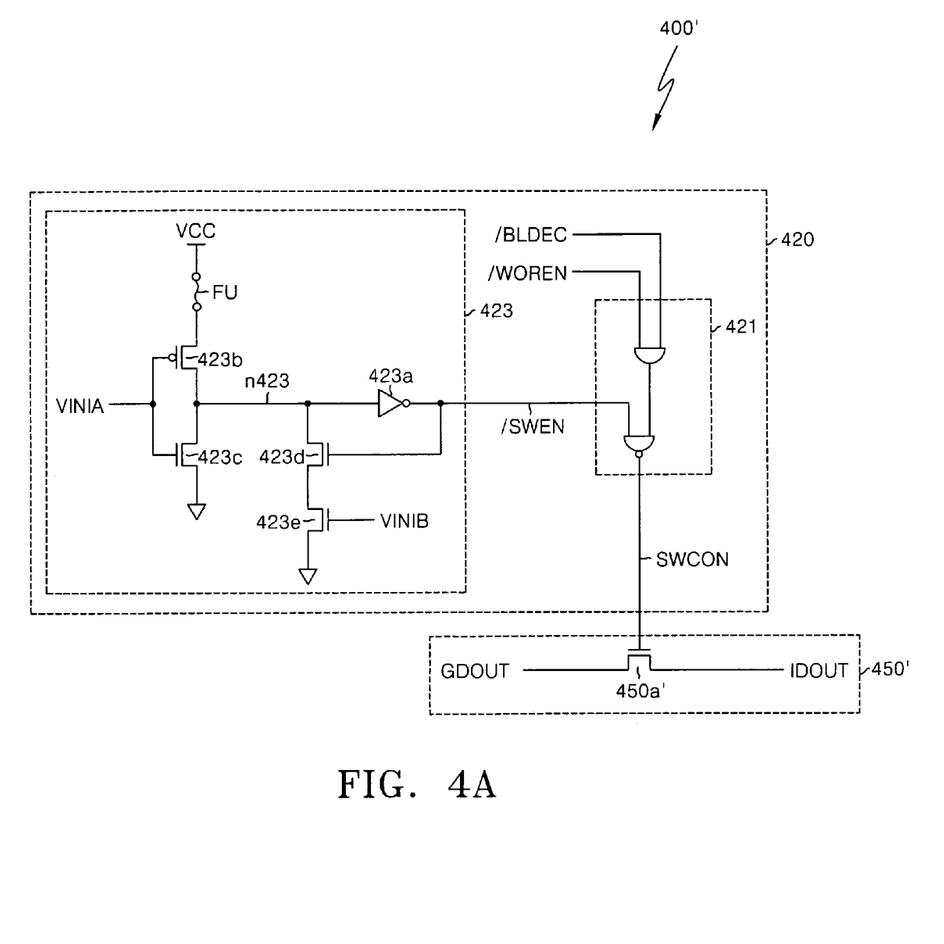
FIG. 4A is a diagram illustrating another example of the output switch shown in FIG. 1.
Figure 4B:
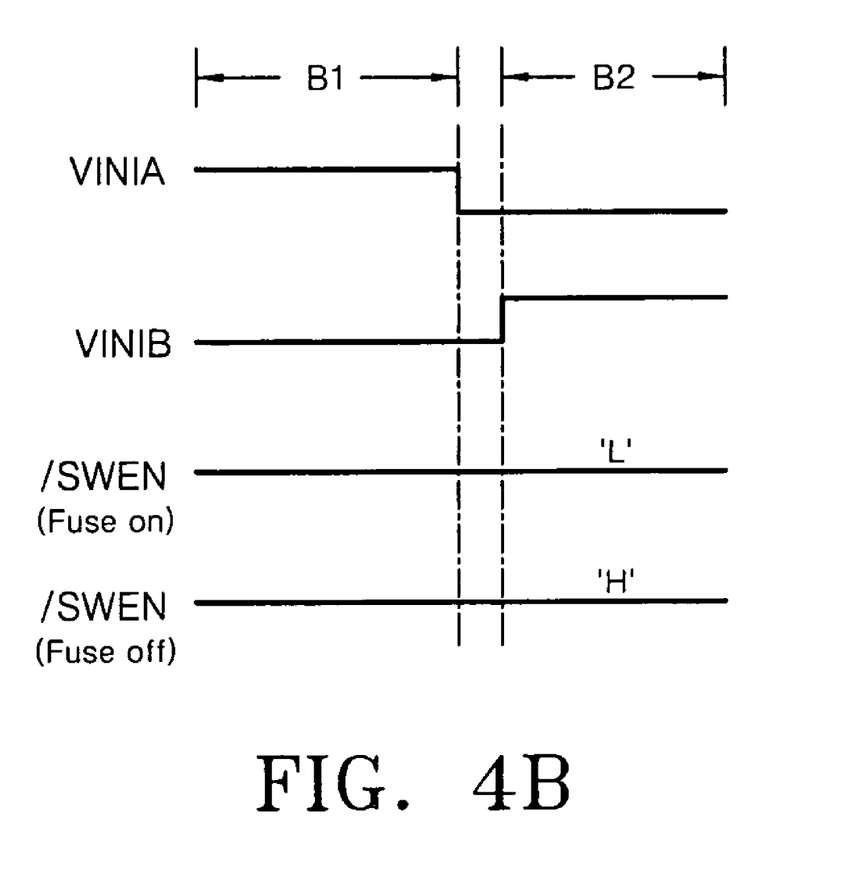
FIG. 4B is a timing diagram showing voltages and signals at nodes in FIG. 4A.

FIG. 4A is a diagram illustrating another example of the output switch 400 shown in FIG. 1, being similar to the output switch 400 shown in FIG. 3A. FIG. 4B is a timing diagram showing voltages and signals at nodes in FIG. 4A. Referring to FIG. 4A, the output switch 400' is also comprised of a switching control circuit 420 and an output transmission circuit 450'. The switching control circuit 420 is comprised of a switching logic-gating circuit 421 and a switching-enable circuit 423. The structures and operations of the output transmission circuit 450' and the switching logic-gating circuit 421 shown in FIG. 4A are as same as those of the output transmission circuit 450 and the switching logic-gating circuit 411 shown in FIG. 3A, so will not be described about those features again in detail.

The switching-enable circuit 423 includes the control fuse FU, generating the switching-enable signal /SWEN. The switching-enable circuit 423 includes an inverter 423a, a PMOS transistor 423b, the control fuse FU, a first NMOS transistor 423c, a second NMOS transistor 423d, and a third NMOS transistor 423e. The inverter 423a logically inverts a signal at an input terminal n423, generating the switching-enable signal /SWEN. The PMOS transistor 423b is conductive in response to a first initializing control signal VINA in order to control the input terminal n423 of the inverter 423a on a logical "H" level.

The control fuse FU is connected to the PMOS transistor 423b between the power source voltage VCC and the input terminal n423 of the inverter 423a. Thus, when the control fuse FU is cut off, it interrupts the logical "H" regulation for the input terminal n423 of the inverter 423a by the PMOS transistor 423b.

The first NMOS transistor 423c is driven in response to the first initializing control signal VINIA. The first NMOS transistor 423c makes the input terminal n423 of the inverter 423a be set on a logical "L" level when the control fuse FU is cut off.

And, the second NMOS transistor 423d latches a logical state of the switching-enable signal /SWEN, which is generated when the control fuse FU is cut off, together with the inverter 423a.

The third NMOS transistor 423e is connected between the second NMOS transistor 423d and the ground voltage VSS. And, the third NMOS transistor 423e gated by a second initializing control signal VINIB, is turned on after the first NMOS transistor 423c is turned off.

In summary, when the control fuse FU is connected, the switching-enable signal /SWEN is set on a logical "L" level as illustrated in FIG. 4B. Thus, the switching control signal /SWCON is enabled with a logical "H" level in response to logical "L" activation of the wired-ORing signal /WOREN.

Otherwise, if the control fuse FU is cut off, the switching-enable signal /SWEN is fixed to a logical "H" level. Therefore, when the control fuse FU is being cut off, the switching control signal /SWCON does not be activated with a logical "H" level.

Figure 5A:
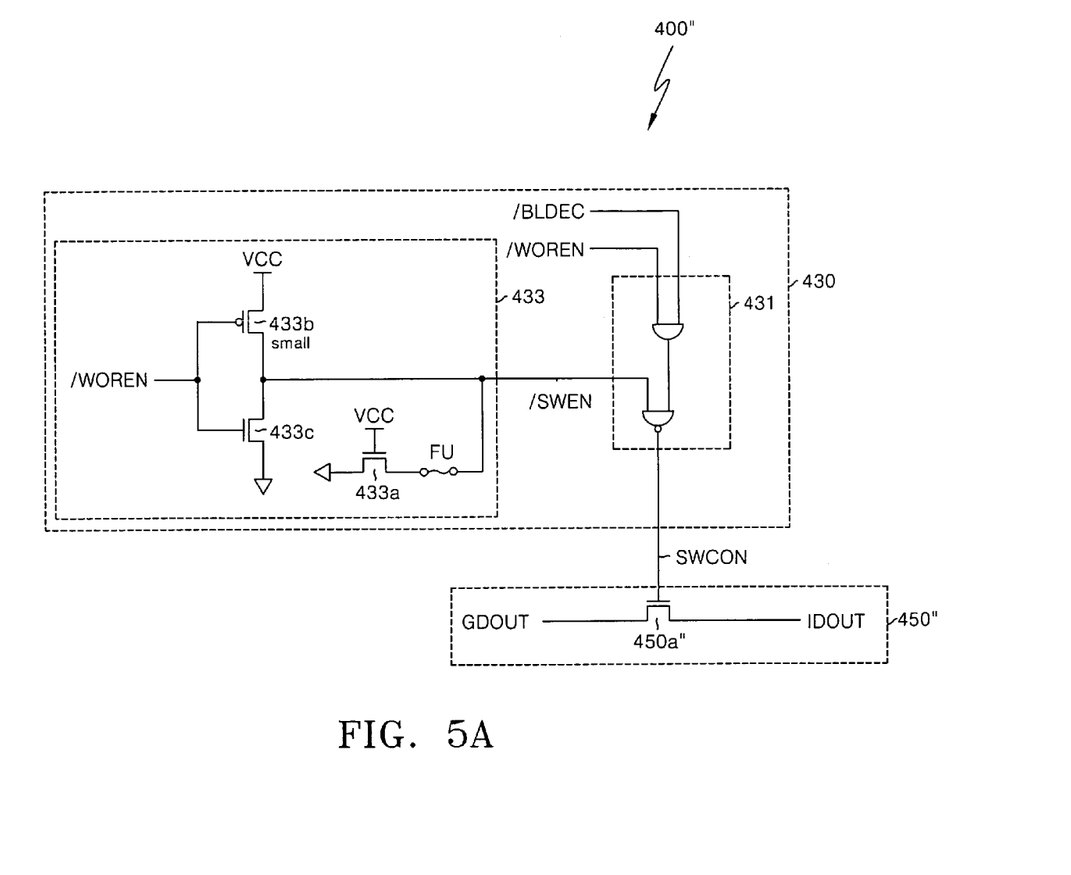
FIG. 5A is a diagram illustrating another example of the output switch shown in FIG. 1.
Figure 5B:
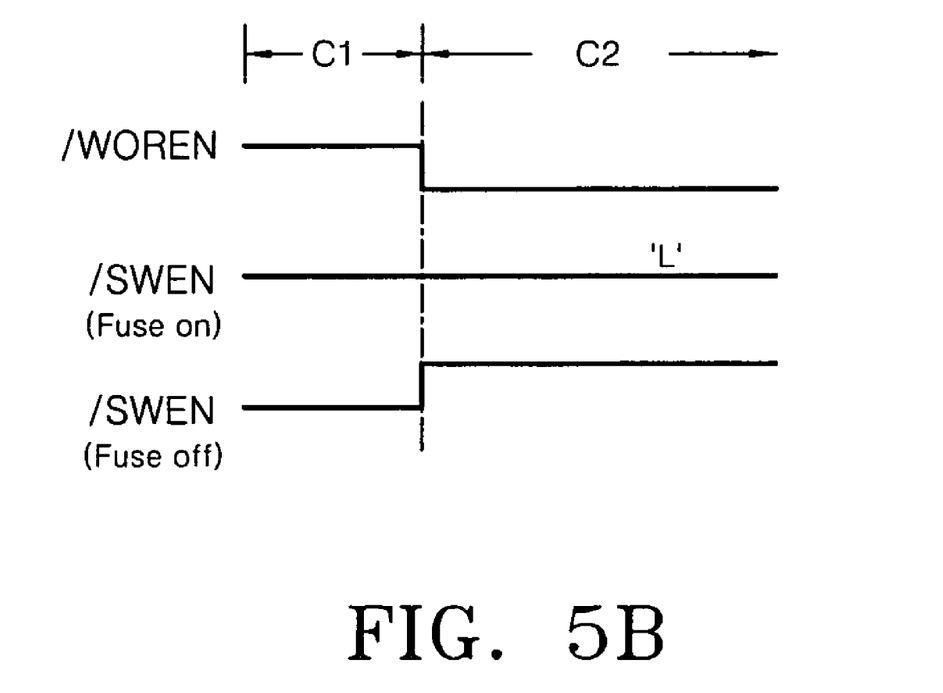
FIG. 5B is a timing diagram showing voltages and signals at nodes in FIG. 5A.

FIG. 5A is a diagram illustrating another example of the output switch 400 shown in FIG. 1, being similar to the output switches 400 and 400' of FIGS. 3A and 4A. FIG. 5B is a timing diagram showing voltages and signals at nodes in FIG. 5A. Referring to FIG. 5A, the output switch 400" includes a switching control circuit 430 and an output transmission circuit 450". The switching control circuit 430 includes a switching logic-gating circuit 431 and a switching-enable circuit 433. The structures and operations of the output transmission circuit 450" and the switching logic-gating circuit 431 shown in FIG. 5A are as same as those of the output transmission circuit 450 and the switching logic-gating circuit 411 shown in FIG. 3A, so will not be described about those features again in detail.

The switching-enable circuit 433 generates the switching-enable signal /SWEN. The switching-enable circuit 433 includes a first NMOS transistor 433a, a control fuse FU, a PMOS transistor 433b, and a second NMOS transistor 433c.

The first NMOS transistor 433a and the control fuse FU are connected between the switching-enable signal /SWEN and the ground voltage VSS in series. Thus, when the control fuse FU is not cut, the first NMOS transistor 433a pulls the switching-enable signal /SWEN to a logical "L" level (refer to FIG. 5B). However, if the control fuse FU is cut, it the switching-enable signal /SWEN is no longer affected by the first NMOS transistor 433a.

The PMOS transistor 433b and the second NMOS transistor 433c are gated by the wired-ORing signal /WOREN. Thus, the second NMOS transistor 433c makes the switching-enable signal /SWEN a logical "L" level when the wired-ORing signal is a logical "H" level (C1 of FIG. 5B).

The PMOS transistor 433b pulls the switching-enable signal /SWEN to a logical "H" level in the wired-OR operation period (C2 of FIG. 5B) when the control fuse FU is cut.

In summary, when the control fuse FU is not cut, the switching-enable signal /SWEN is set to a logical "L" level as illustrated in FIG. 5B. Thus, the switching control signal /SWCON is enabled with a logical "H" level in response to logical "L" activation of the wired-ORing signal /WOREN.

Alternatively, if the control fuse FU is cut, the switching-enable signal /SWEN is fixed to a logical "H" level. Therefore, when the control fuse FU is cut, the switching control signal /SWCON is not activated with a logical "H" level.

In the output switch, 400, 400' or 400", shown in FIGS. 3A, 4A or 5A, respectively, the control fuse FU is embedded in the switching control circuit 410, 420, or 430. As such, a time delay is rarely generated in data output. Therefore, the switching control circuit as shown in FIGS. 3A, 4A or 5A may be efficiently used in a nonvolatile semiconductor memory device using the same read path either in a verifying (verifying-read) mode or a read (normal read) mode.

Figure 6:
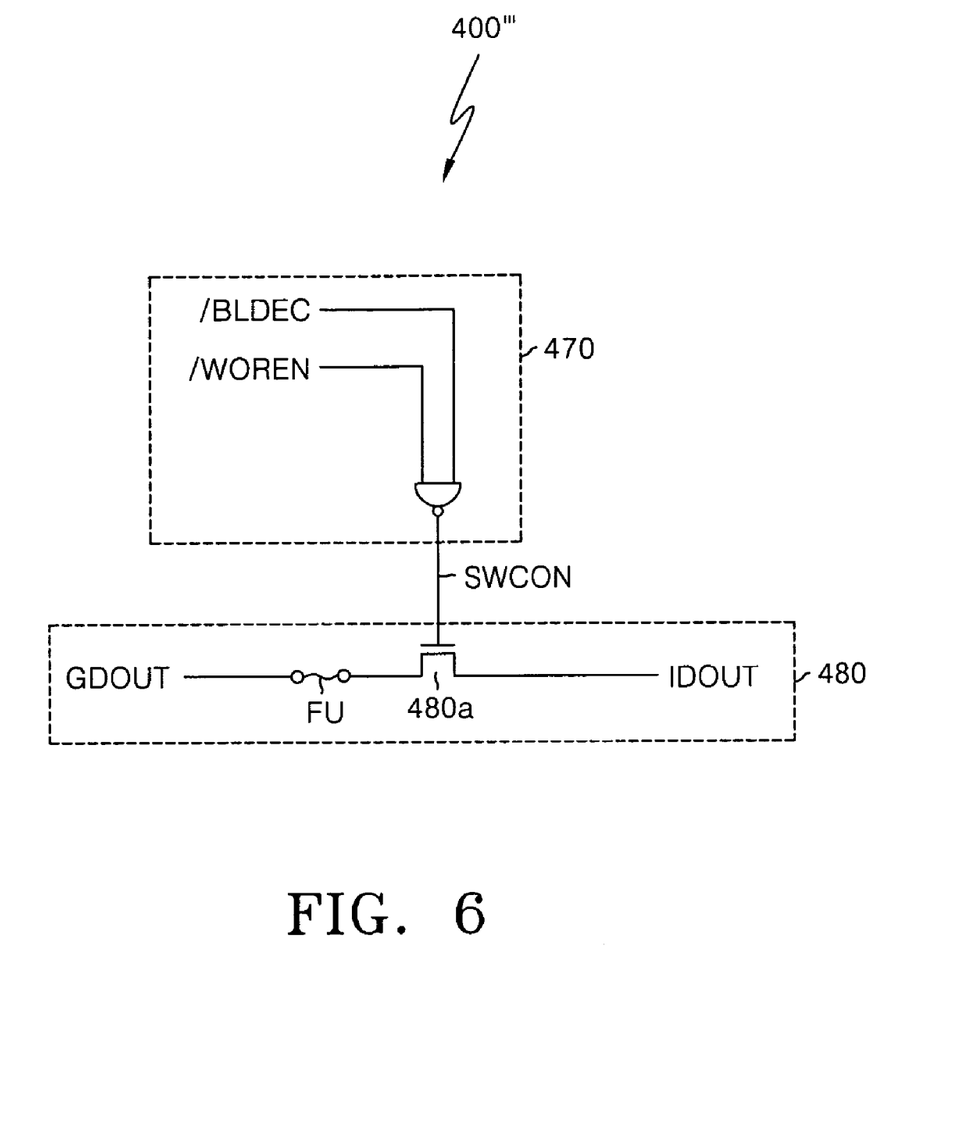
FIG. 6 is a diagram illustrating another example of the output switch shown in FIG. 1.

FIG. 6 is a diagram illustrating another example of the output switch 400 shown in FIG. 1. Referring to FIG. 6, the output switch 400''' includes a switching control circuit 470 and an output transmission circuit 480. The switching control circuit 470 generates a switching control signal SWCON that is enabled in the wired-OR period. The structure and operation of the switching control circuit 470 may be easily understood by those skilled in the art with reference to the descriptions about the switching logic-gating circuit 411 shown in FIG. 3A, so will not be explained about that in more detail.

The output transmission circuit 480 includes the control fuse FU. The output transmission circuit 480 connects the internal output line IDOUT with the global output line GDOUT in response to a logical "H" activation of the switching control signal SWCON. But, if the control fuse FU is cut off, the internal output line IDOUT is disconnected from the global output line GDOUT.

The output transmission circuit 480 includes a switching transistor 480a and the control fuse FU. The switching transistor 480a is gated in response to the switching control signal SWCON. The control fuse FU is connected to the switching transistor 480a in series between the internal output line IDOUT and the global output line GDOUT.

As the internal output line IDOUT is disconnected with the global output line GDOUT when the control fuse FU is cut off, a data is not further output from the internal output line IDOUT of the corresponding page buffer set 200.

Meanwhile, in the output switch 400''', the control fuse FU is included in the output transmission circuit 480. As such, the embodiment shown in FIG. 6, where the control fuse FU is embedded in the output transmission circuit 480, is advantageous to implementing circuit configuration very easily. But, the control fuse FU may cause a time delay in data output. Therefore, the embodiment shown in FIG. 6 may be applicable to a nonvolatile semiconductor memory device having different data read-out paths with respect to the verifying and read modes.

Figure 7:
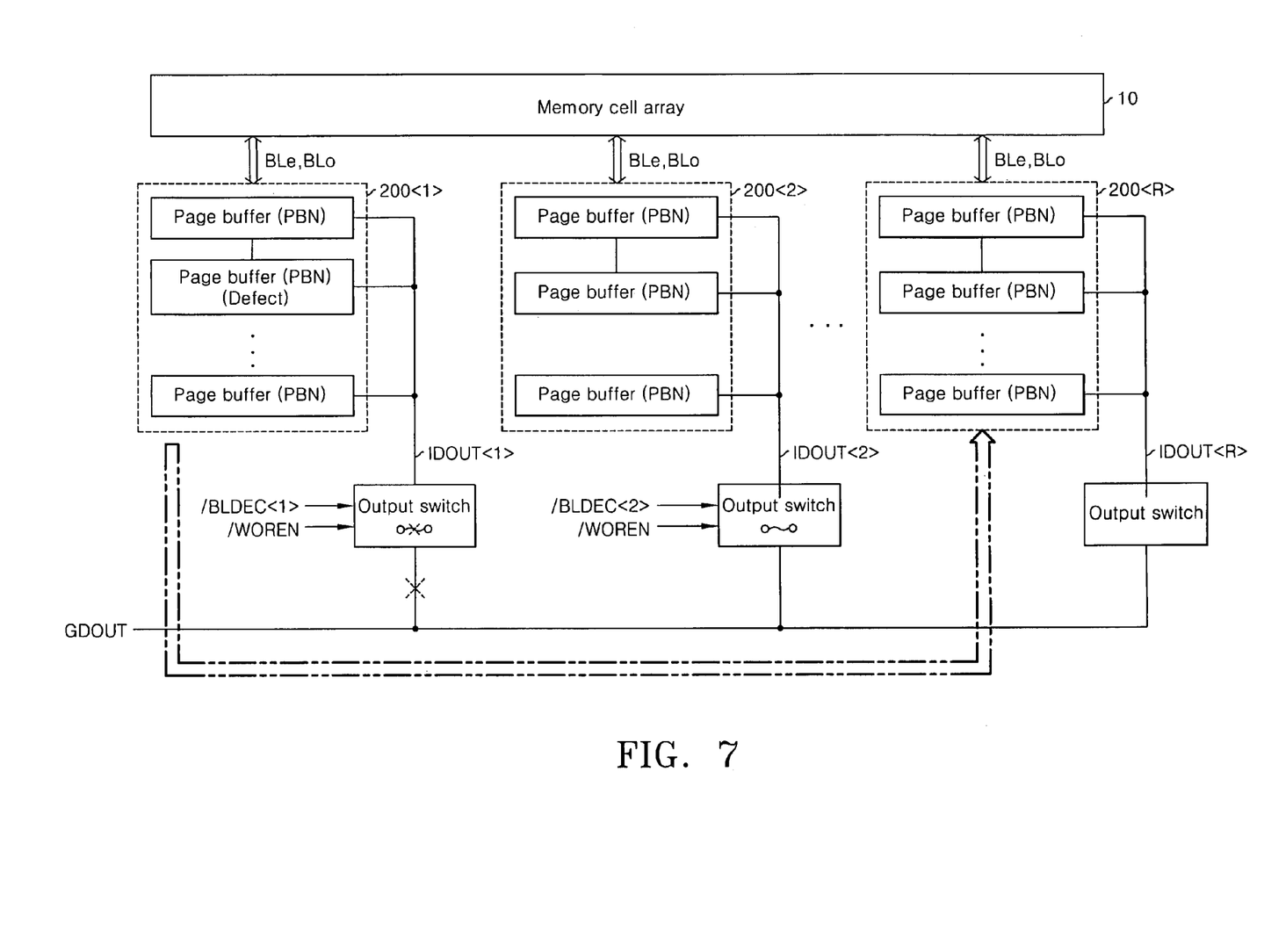
FIG. 7 is a diagram illustrating a feature of substituting a defective page buffer set with a spare page buffer set in the nonvolatile semiconductor memory device of the present invention.

As such, the nonvolatile semiconductor memory device having an above described embodiment of an output switch is able to disconnect the global output line GDOUT from the internal output line IDOUT of the page buffer set 200 having a page buffer PBN involved in a defect, by way of cutting the control fuse FU of the output switch 400. And, the page buffer set 200 corresponding to the control fuse FU that is cut off may be substituted with a spare page buffer set 200<R> as illustrated in FIG. 7.

Such an internal output line of the nonvolatile semiconductor memory device according to the invention is shared by the page buffers. The internal output line may be driven to the ground voltage by each output driver of each page buffer. Thus, the nonvolatile semiconductor memory device of the invention is able to execute the program-verifying operation in the manner of wired-OR scheme.

In addition, the output switch of the nonvolatile semiconductor memory device according to an embodiment includes the control fuse. If the control fuse is cut off, the internal output line corresponding thereto is electrically disconnected with the global output line. Thus, it blocks or interrupts data transmission from a page buffer set having a defect. As the interruption of data transmission in the nonvolatile semiconductor memory device is carried out in the unit of page buffer set, it a decreased of layout size for the control fuses, simplicity of circuit construction, and high efficiency of fuse control in testing or repairing the device.

Although the invention has been described in connection the embodiments illustrated in the accompanying drawings, it is not limited thereto. It will be apparent to those skilled in the art that various substitution, modifications and changes may be thereto without departing from the scope and spirit of the invention.

What is claimed is:

1. A nonvolatile semiconductor memory device comprising:
 a page buffer set having a plurality of page buffers;
 a fuse;
 a switching enable circuit to generate a switching enable signal in response to a state of the fuse; and a switching unit to couple an internal output line with a wired-OR structure directly coupled to each page buffer of the page buffer set to a global output line in response to the switching enable signal.

2. The nonvolatile semiconductor memory device of claim 1, the switching enable circuit further to disable the switching unit if the fuse is cut.

3. The nonvolatile semiconductor memory device of claim 1, the switching enable circuit further to disable the switching unit if the fuse is uncut.

4. The nonvolatile semiconductor memory device of claim 1, the switching enable circuit further comprising:
 a pull down circuit to pull down a node in response to a control signal;
 the fuse coupled to the node to pull up the node; and
 a latch circuit to generate the switching enable signal in response to a voltage of the node.

5. The nonvolatile semiconductor memory device of claim 4, the pull down circuit further comprising a transistor having a drain coupled to the node, a source coupled to a ground, and a gate to receive the control signal.

6. The nonvolatile semiconductor memory device of claim 4, the latch circuit further comprising:
 an inverter to generate the switching enable signal in response to the voltage of the node; and
 a transistor to pull down the node in response to the switching enable signal.

7. The nonvolatile semiconductor memory device of claim 1, the switching enable circuit further comprising:
 a driver circuit to drive a node in response to a control signal, the driver circuit prevented from pulling up the node up if the fuse is cut; and
 a latch circuit to generate the switching enable signal in response to a voltage of the node.

8. The nonvolatile semiconductor memory device of claim 7, the latch circuit further to pull down the node in response to a second control signal.

9. The nonvolatile semiconductor memory device of claim 7, the pull down circuit further comprising:
 a PMOS transistor having a source coupled to the fuse, a drain coupled to the node, and a gate to receive the control signal; and
 an NMOS transistor having a source coupled to a ground, a drain coupled to the node, and a gate to receive the control signal.

10. The nonvolatile semiconductor memory device of claim 7, the latch circuit further comprising:
 an inverter to generate the switching enable signal in response to the voltage of the node;
 a first NMOS transistor having a source coupled to a ground and a gate to receive a second control signal; and
 a second NMOS transistor having a drain coupled to the node, a source coupled to a drain of the first NMOS transistor, and a gate to receive the switching enable signal.

11. The nonvolatile semiconductor memory device of claim 1, the switching enable circuit further comprising:

a driver circuit to generate the switching enable signal on a node in response to a control signal; and
 a pull down circuit to pull down the node if the fuse is uncut.

12. The nonvolatile semiconductor memory device of claim 11, the driver circuit having a pull up capability smaller than the pull down capability of the pull down circuit.

13. The nonvolatile semiconductor memory device of claim 11, the driver circuit further comprising:
 a PMOS transistor having a source coupled to a power supply, a drain coupled to the node, and a gate to receive the control signal; and
 an NMOS transistor having a source coupled to a ground, a drain coupled to the node, and a gate to receive the control signal.

14. The nonvolatile semiconductor memory device of claim 11, the pull down circuit further comprising:
 an NMOS transistor having a source coupled to a ground, a drain coupled to a first end of the fuse, and a gate coupled to a power supply; and
 a second end of the fuse coupled to the node.

15. A nonvolatile semiconductor memory device comprising:
 a page buffer set having a plurality of page buffers;
 an internal output line having a wired-OR structure directly coupled to each page buffer of the page buffer set; and
 a fuse coupled between the internal output line and a global output line.

16. The nonvolatile semiconductor memory device of claim 15, further comprising a switching device in series with the fuse to couple the internal output line to the global output line in response to a switching enable signal.

17. A method of operating a semiconductor memory device comprising:
 detecting a defect in at least one of a plurality of page buffers of a page buffer set; and
 decoupling an internal output line having a wired-OR structure directly coupled to each page buffer of the page buffer set from a global output line using a fuse in response to detecting the defect.

18. The method of claim 17, further comprising enabling a replacement page buffer set.

19. The method of claim 17, decoupling an internal output line further comprising:
 setting a control line to a disable state in response to a state of the fuse; and
 disabling a switch coupling an output of the page buffer set to other circuitry of the semiconductor memory device in response to a state of the control line.

20. The method of claim 17, decoupling an internal output line further comprising cuffing the fuse to cut the electrical connection from an output of the page buffer set to other circuitry of the semiconductor memory device.

21. The nonvolatile semiconductor memory device claim 1, further comprising:
 a plurality of data input lines coupled to the page buffers;
 wherein the data input lines are physically distinct from the internal output line.

* * * * *

UNITED STATES PATENT AND TRADEMARK OFFICE
CERTIFICATE OF CORRECTION

PATENT NO.        : 7,542,366 B2
APPLICATION NO.   : 11/333983
DATED             : June 2, 2009
INVENTOR(S)       : Hyung Gon Kim

Page 1 of 1

It is certified that error appears in the above-identified patent and that said Letters Patent is hereby corrected as shown below:

Column 10, line 51, the word "cuffing" should read -- cutting --;
Column 10, line 54, the word "device" should read -- device of --.

Signed and Sealed this

Twentieth Day of October, 2009

David J. Kappos
*Director of the United States Patent and Trademark Office*